United States Patent
Hockanson et al.

(10) Patent No.: US 8,514,549 B2
(45) Date of Patent: Aug. 20, 2013

(54) POWER INTEGRITY CIRCUITS WITH EMI BENEFITS

(75) Inventors: David Hockanson, Boulder Creek, CA (US); Istvan Novak, Maynard, MA (US); Leesa Noujeim, Sunnyvale, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 13/048,738

(22) Filed: Mar. 15, 2011

(65) Prior Publication Data
US 2011/0164392 A1    Jul. 7, 2011

Related U.S. Application Data

(63) Continuation of application No. 11/737,484, filed on Apr. 19, 2007.

(51) Int. Cl.
*H01G 4/228* (2006.01)

(52) U.S. Cl.
USPC ........ 361/538; 361/302; 361/763; 361/301.2; 361/738; 361/535

(58) Field of Classification Search
USPC ............ 361/763, 302, 301.4, 301.2, 738, 361/538, 535–541, 766, 306
See application file for complete search history.

(56) References Cited

U.S. PATENT DOCUMENTS

| | | | |
|---|---|---|---|
| 6,532,143 B2* | 3/2003 | Figueroa et al. | 361/301.4 |
| 7,023,685 B2* | 4/2006 | Fujiyama et al. | 361/306.1 |
| 2002/0054471 A1* | 5/2002 | Adae-Amoakoh et al. | 361/302 |
| 2002/0191366 A1* | 12/2002 | Naito et al. | 361/302 |
| 2005/0121772 A1* | 6/2005 | Hayashi et al. | 257/700 |

* cited by examiner

*Primary Examiner* — Tuan T Dinh
*Assistant Examiner* — Steven Sawyer
(74) *Attorney, Agent, or Firm* — Polsinelli PC

(57) ABSTRACT

A stable power, low electromagnetic interference (EMI) apparatus and method for connecting electronic devices and circuit boards is disclosed. The apparatus involves a capacitor which includes a body member, a set of power terminals and a set of ground terminals connected to the top of the body member. The set of power terminals and the set of ground terminals alternate one with another. As a result of this configuration, a high inductance on the PCB side is achieved. The capacitor further includes a set of terminals connected to the bottom of the body member and includes metal planes within the body member. The metal planes are positioned to electrically connect either the set of power terminals or the set of ground terminals to the set of terminals.

8 Claims, 10 Drawing Sheets

POWER INTEGRITY CIRCUITS WITH EMI BENEFITS

CROSS-REFERENCE TO RELATED APPLICATIONS

This application claims priority to U.S. patent application Ser. No. 11/737,484 entitled "POWER INTEGRITY CIRCUITS WITH EMI BENEFITS", naming Hockanson et al. as inventors and filed on Apr. 19, 2007, the entirety of which is hereby incorporated by reference.

FIELD OF THE INVENTION

Aspects of the present invention relate to circuit design. More particularly, aspects of the present invention relate to arrangements of pinout connections between electronic devices and circuit boards to enhance power integrity and reduce electromagnetic interference (EMI).

BACKGROUND

As central processing units (CPUs) and other electronic devices increase in speed and capability they also continue to require more power. In addition, in order to function properly, electronic devices require a stable power supply that does not fluctuate beyond acceptable amounts. Power supply fluctuations, which might involve voltage level fluctuations and parasitic voltage influences, can be caused by high impedance power supply networks. Conventionally, providing a stable power supply (referred to as "power integrity") is achieved by designing a low impedance power delivery network. However, as the power of the network increases, EMI also increases, which may cause a variety of problems including computational inaccuracies in electronic devices, interference between devices and damage to electronic devices and/or circuit boards, as well as difficulties in meeting Federal Communications Commission (FCC) EMI requirements.

Conventional pinouts on the bottom side of a central processing unit (CPU) package have vias arranged in various power/ground configurations. The CPU package is then attached to a printed circuit board (PCB) with either a socket or through soldering in a ball grid array (BGA) or pin arrangements. The power and ground vias provide power and ground connections between the CPU and the PCB. These contacts are straight-through metal contacts with the pinout on the top side of the PCB being the same as the pinout at the bottom side of the CPU package. The straight-through metal nature of the contacts has heretofore been an impediment to regulating the power transferred between the PCB and the CPU package.

SUMMARY

One aspect of the present invention involves a pass through capacitor. The pass through capacitor includes at least one first terminal in electrical communication with at least one first corresponding conductive member. The pass through capacitor further includes at least one second terminal in electrical communication with at least one corresponding second conductive member. The at least one first conductive member and the at least one second conductive member are physically separated by a dielectric material, and an at least one third terminal is in electrical communication with the at least one first conductive member. The at least one second conductive member is electrically connectable by way of the at least one second terminal. Where the at least one second conductive member is otherwise electrically isolated by the dielectric material.

Another aspect of the present invention involves an apparatus. The apparatus includes an electronic device, a circuit, and a plurality of pass-through capacitors. The plurality of pass-through capacitors are electrically connected between the electronic device and the circuit. Each pass-through capacitor has power and ground terminals, and a portion of the power terminals and a portion of the ground terminals are electrically isolated from the circuit.

A further aspect of the present invention involves a method for implementing a high inductance pinout with low EMI. The method includes obtaining a plurality of capacitors each having a first set of power and ground terminals and a second set of power and ground terminals. The method further includes connecting an electronic device to the first set of power and ground terminals of the plurality of capacitors, and connecting a circuit to a portion of the second set of power and ground terminals of the plurality of capacitors. Further, the method provides for electrical isolation of a portion of the power terminals, and for electrical isolation of a portion of the ground terminals.

DETAILED DESCRIPTION

Aspects of the present invention include a configuration of pass-through capacitors connecting a CPU to a PCB to provide stable power with low EMI. Other aspects of the present invention include a particularly configured pass-through capacitor, and the deployment of these capacitors to connect an electronic device (e.g. a CPU package) to a PCB or other electronic device. Various implementations set forth herein may provide stable power to the electronic device, have low EMI, or both.

Figure 1:
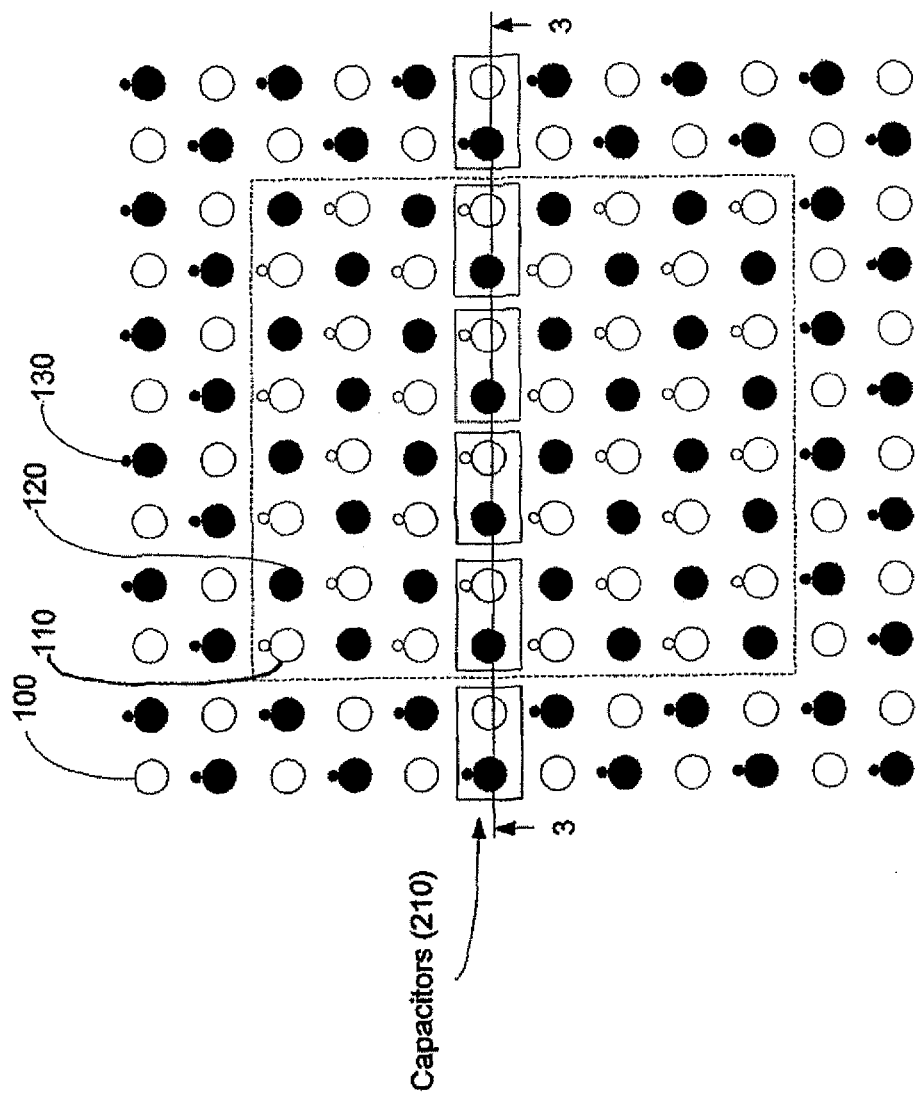
FIG. 1 is a diagram illustrating a pinout configuration for one embodiment of the present invention.
Figure 2B:
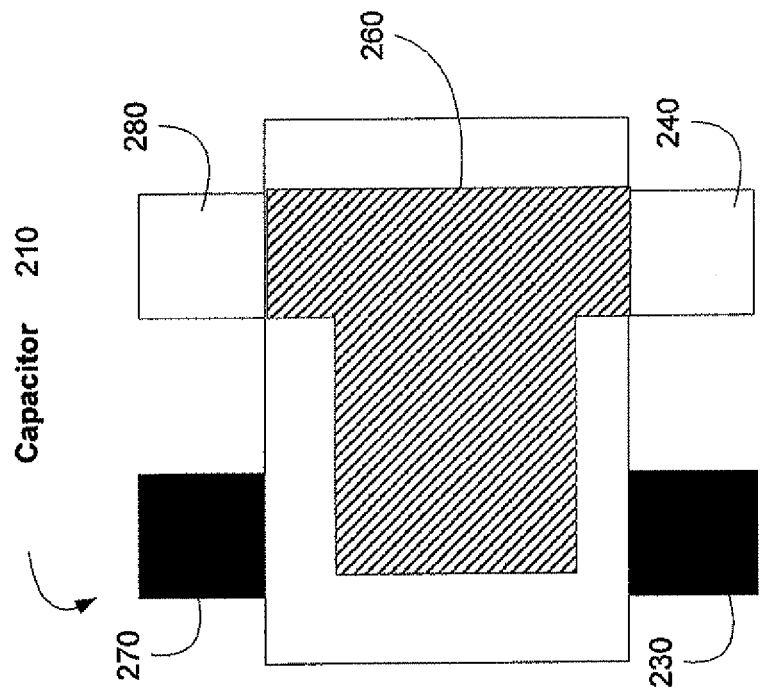
FIG. 2B is a second representative section view of the pass-through capacitor set forth in FIG. 2A.
Figure 2A:
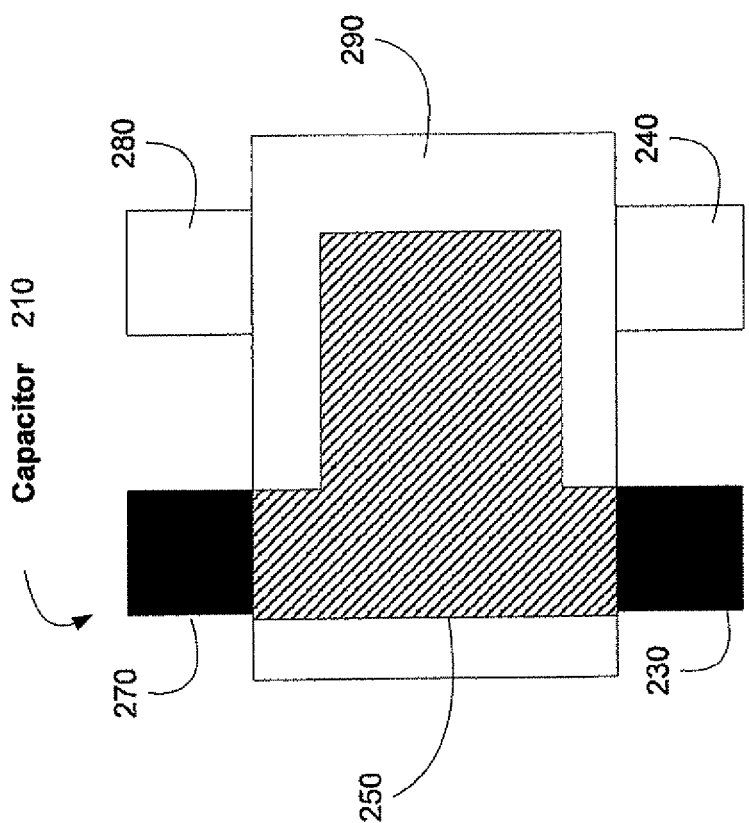
FIG. 2A is a first representative section view of one example of a pass-through capacitor for one implementation of the present invention.
Figure 3:
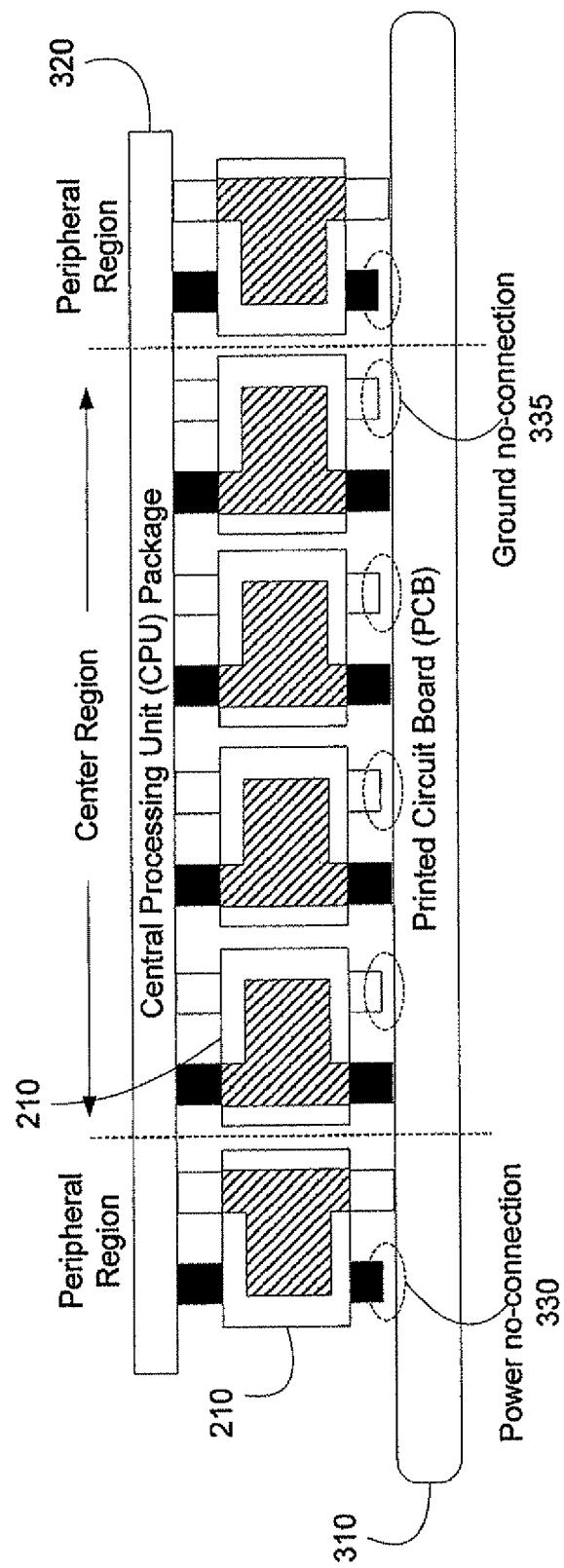
FIG. 3 is a schematic diagram illustrating one arrangement of pass-through capacitors connecting a CPU package to a printed circuit board.

FIG. 1 is a diagram of a PCB side pinout arrangement implementing pass-through capacitors in accordance with one possible implementation conforming to aspects of the present invention. The pass-through capacitor used in the FIG. 1 arrangement is shown in FIGS. 2A and 2B. FIG. 3 is a section view taken along line 3-3 of FIG. 1. FIG. 3 also illustrates a CPU package and a PCB that are interconnected with the pattern of capacitors of FIG. 1.

Each pass-through capacitor has a ground and a power terminal on both its top and bottom side. Thus, as shown in FIG. 1, each circle on the pin out pattern represents either a connected 100 or no-connected 110 ground terminal (clear circle, clear circle with second smaller clear circle) or a connected 120 or no-connected 130 power terminal (shaded black circle, shaded black circle with second smaller shaded black circle) between each capacitor and the PCB. Stated another way, this pinout configuration is achieved by no-connecting either the power or ground terminals on the PCB side of the pass-through capacitors. A pair of circles next to each other illustrates one pass-through capacitor. As used herein the term "no-connected" may refer to a connection that is physically connected but not electrically connected or may refer to a connection that is neither physically nor electrically connected. Thus, when a terminal is no-connected, the terminal may have a physical bond of some sort, but the bond is not electrically conducting, or not have a physical bond at all. The grey circles represent connected ground terminals and the black circles represent connected power terminals. The hashed grey circles represent no-connected ground terminals, and the hashed black circles represent no-connected power terminals.

FIGS. 2A and 2B illustrate representative section views of a particular pass-through capacitor 210 configuration used to implement aspects of the present invention. FIG. 2A is a section view illustrating a bottom power terminal 230 interconnected with a top power terminal 270 by way of a metal power plane 250 or other conducting member. The power terminals 230 and 270 may be metal terminals which is designated as a power terminal based on its connectivity to power plane 250. FIG. 2B is a section view illustrating a bottom ground terminal 240 interconnected with a top ground terminal 280 by way of a metal ground plane 260 or other conducting member. Similar to the power terminals 230 and 270, the ground terminals 240 and 280 may be metal terminals which is designated as a ground terminal based on its connectivity to the ground plain 260. The power and ground planes 250 and 260 are separated by a dielectric 290. Metal power plane 250 may be used to pass power through the capacitor 210. In one embodiment, the power is directly passed through capacitor 210. Metal ground plane 260 may similarly be used to provide a ground connection through the capacitor 210.

Top power and ground terminals 270 and 280 are used to connect the capacitor 210 to an electronic device. In one embodiment, the electronic device is a CPU package; however, other electronic devices may be used. The bottom power and ground terminals 230 and 240 are used to connect the capacitor 210 to a PCB. In another embodiment, the bottom terminals 230 and 240 may be used to connect to another electronic device. The bottom terminals 230 and 240 may be connected to a variety of electronic devices and/or circuit boards. However, for illustrative purposes only, throughout this description aspects of the present invention are discussed in the context of the connections between a CPU package and a PCB.

FIG. 3 is a representative section/schematic view taken along line 3-3 of FIG. 1. Multiple capacitors 210 are arranged in such a way to maintain low impedance between the bottom side of the CPU package 320 and the pass-through capacitors, and to maintain high impedance between the pass-through capacitors and the PCB 310. A representative high impedance may correspond to an inductance of 100 pH and a representative low impedance may correspond to an inductance of 1 pH.

Each capacitor illustrated in FIG. 3 has both power and ground terminals connected to the CPU package. However, a portion of the bottom power terminals 230 and bottom ground terminals of the capacitors 210 are no-connected (e.g. power no-connection 330 and ground no-connection 335) to the PCB 310 in order to implement the pinout configuration in FIG. 1. Referring to both FIG. 1 and FIG. 3, there is a plurality of capacitors in a center region of the pinout having no-connected ground terminals, and there is a plurality of capacitors in an outer peripheral region around the center region with the bottom power terminals 230 no-connected to the top of the PCB 310. Thus, the two configurations of capacitors in the center and outer periphery regions act together to achieve a high inductance connection between the CPU package 320 and the PCB 310. Accordingly, the outer periphery of the pinout provides a high impedance power connection along the capacitor/PCB boundary, which reduces high frequency noise that may be coupled to the PCB resulting in EMI.

Figure 4:
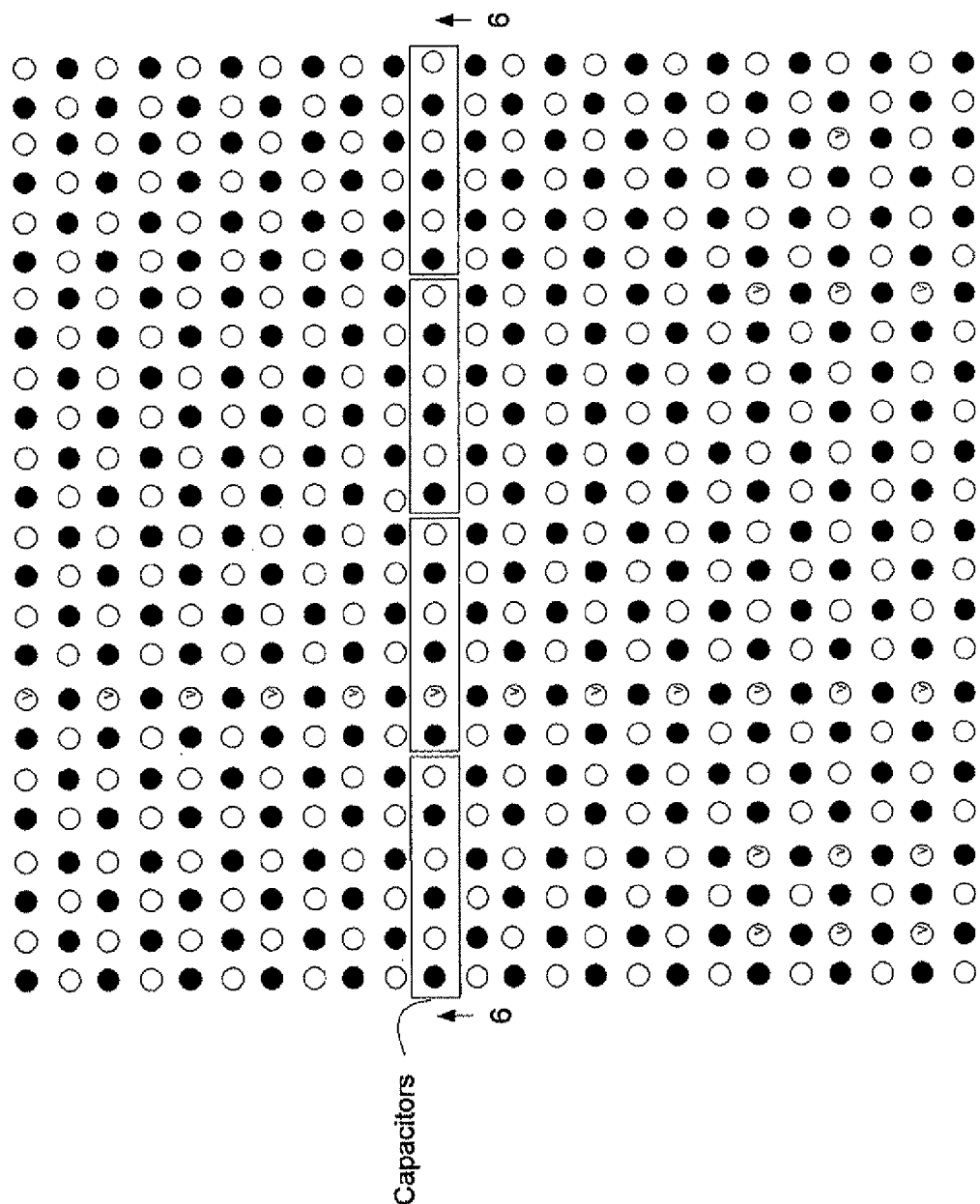
FIG. 4 is a diagram illustrating one example of a checkerboard-like pinout configuration between a CPU package and a plurality of pass-through capacitors.
Figure 5:
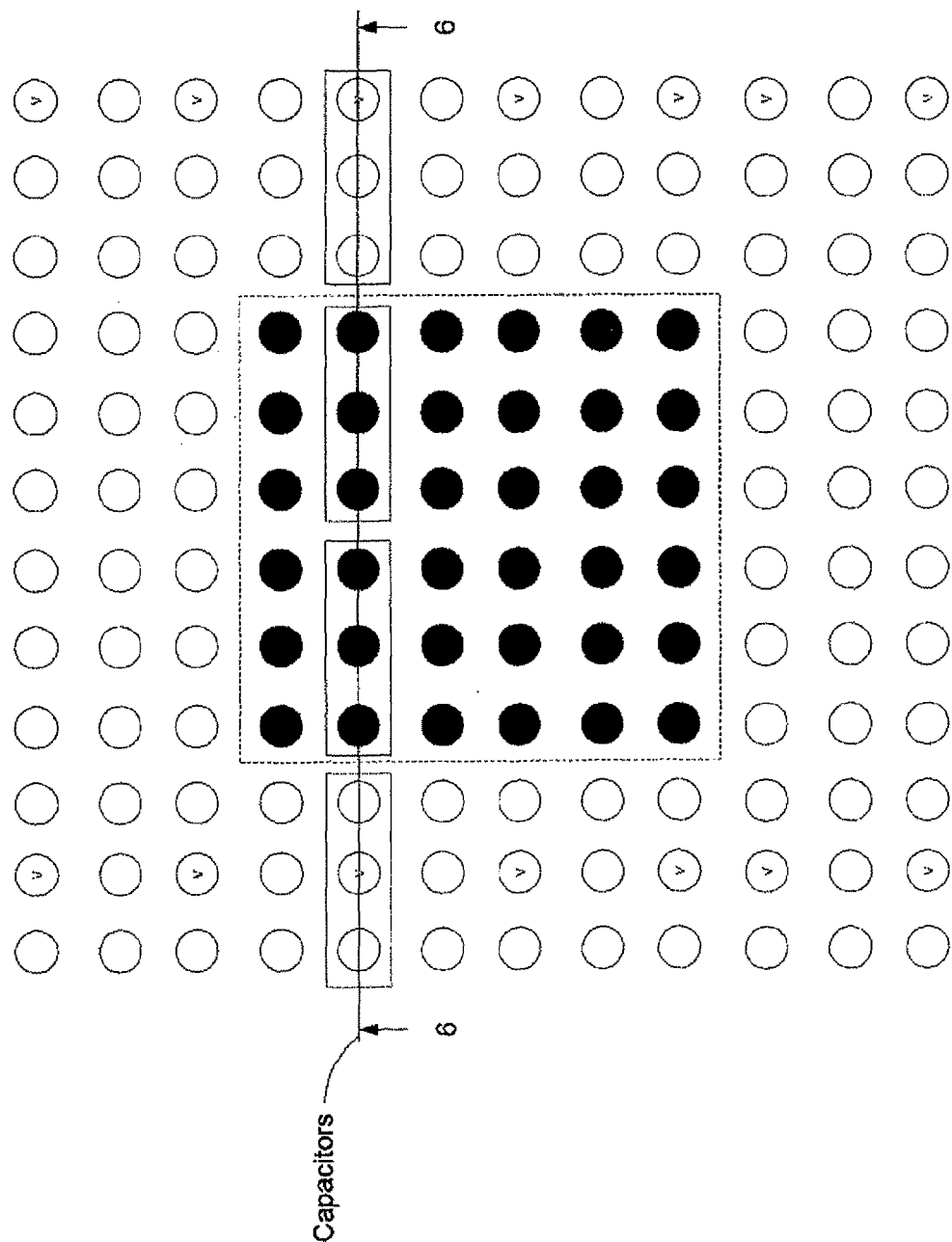
FIG. 5 is a diagram illustrating an example of a pinout configuration between a plurality of pass-through capacitors and a PCB.
Figure 6:
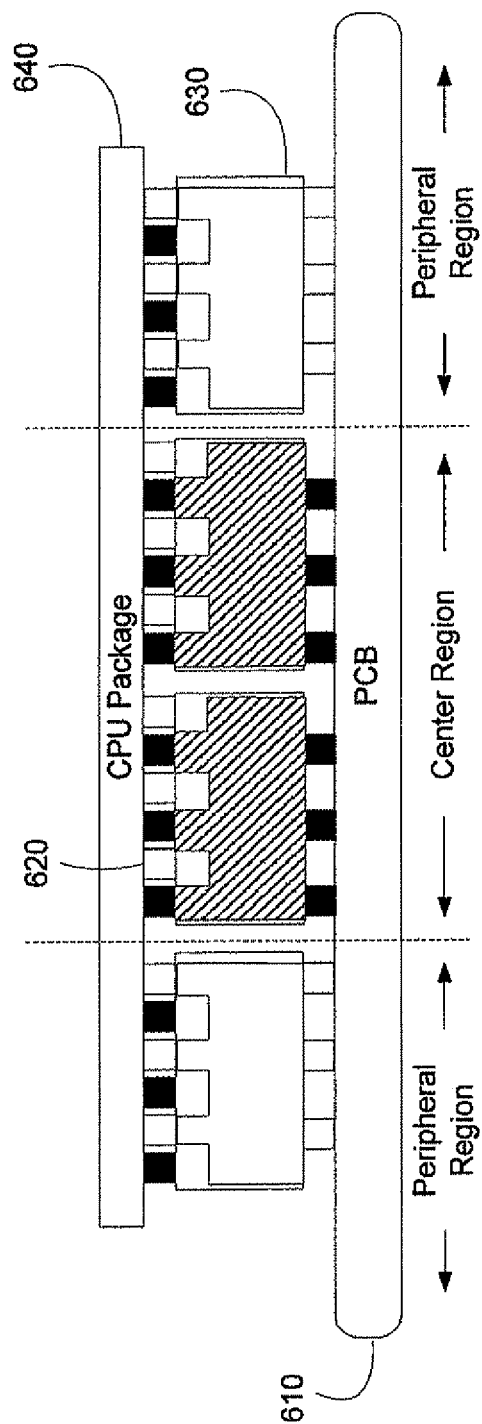
FIG. 6 is a representative section view taken along line 6-6 of FIGS. 4 and 5 illustrating a second arrangement of pass-through capacitors connecting a CPU package to a printed circuit board.
Figure 7B:
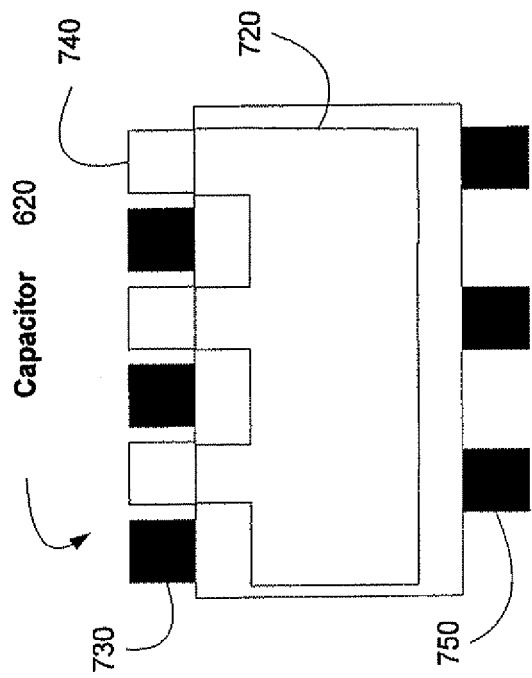
FIG. 7B is a second representative section view of one particular pass-through capacitor conforming to aspects of the present invention.
Figure 7A:
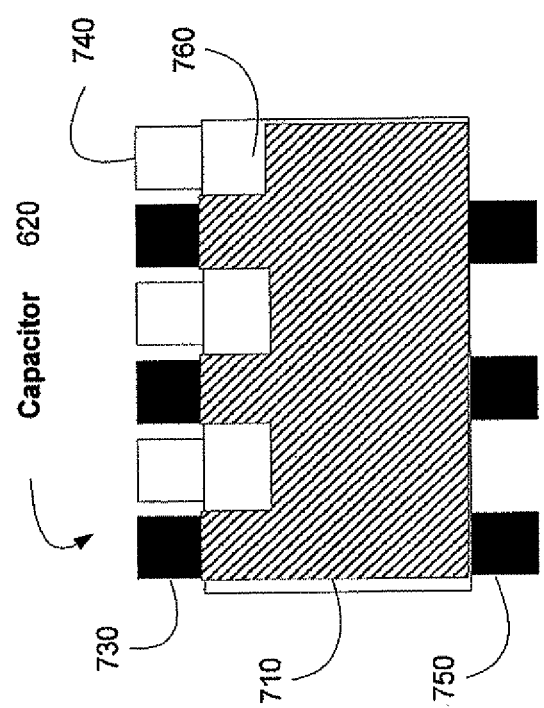
FIG. 7A is a representative section view of one particular pass-through capacitor configuration conforming to aspects of the present invention.

FIGS. 4-6 illustrate an alternative connection arrangement using an alternative pass-through capacitor configuration of FIGS. 7A-7B. FIG. 4 is a diagram depicting a pin connection pattern between a CPU package and a top side of a plurality of capacitors, in accordance with aspects of the present invention. FIG. 5 is a diagram depicting a pin connection pattern between a bottom side of the plurality of capacitors and a PCB. Illustrating both the arrangements of FIGS. 4 and 5, FIG. 6 is a representative section view taken along line 6-6 of both FIGS. 4 and 5, the section view illustrating the plurality of capacitors and the connection pattern between the capacitors and the CPU package as well as between the capacitors and the PCB. The configuration of the capacitors deployed in implementations depicted in FIGS. 4-6 are described in detail below with reference to FIGS. 7A and 7B.

The arrangement between the CPU package and the capacitors provides a lower impedance connection, which thereby provides strong power delivery characteristics. On the other hand, the arrangement between the capacitors and the PCB provides a higher inductance connection thereby lowering EMI levels. Accordingly, the arrangement set forth in FIGS. 4-6 provides adequate power to the CPU while maintaining EMI within acceptable levels. The configuration of FIGS. 4-7 may be used in conjunction as illustrated or separately.

Referring now to FIG. 4, the pinout configuration between the CPU package and the capacitors is in a checkerboard-like pattern. The capacitors displayed in the pinout arrangement have three power terminals and three ground terminals, alternating between power and ground. Similar to FIG. 1, the black circles represent the power connections and the clear circles represent the ground connections. Each power terminal and ground terminal is connected in an alternating arrangement. In one embodiment, the circles may represent socket slots, pins or soldered BGAs. In a further embodiment, the power and ground connections in FIG. 4 may connect an electronic device to a PCB. The connections may alternatively connect one electronic device to another electronic device. Furthermore, the electronic device may be a CPU package or other processing device. Nonetheless, the pinout configuration in FIG. 4 may connect a variety of electronic devices and/or circuit boards.

Referring now to FIG. 5, a high inductance pinout configuration between the capacitors and the PCB. This pinout configuration may be used in conjunction with the pinout configuration of FIG. 4. Like other diagrams, the black circles represent the power connections and the clear circles represent the ground connections. The pinout pattern has power connections in a center region and has ground connections in a peripheral region. The power connections in the center region are achieved by connecting the power terminals on the bottom of the capacitors to the PCB. Unlike the pass-through capacitors illustrated in FIGS. 2A and 2B, the capacitors employed in the FIGS. 4-5 pinout configuration do not have either power or ground terminals on the bottom side. Thus, capacitors without bottom ground terminals are used in the center region. Alternatively, the FIG. 2 capacitors are used with the ground terminals no-connected in the center region. The ground connections in the peripheral region are achieved by using capacitors without the power terminals on the bottom and by connecting the ground terminals. Alternatively, by using a FIG. 2 style capacitor, the power terminals are no-connected in the peripheral region.

As mentioned above, the PCB side of the connection may use this high inductance pinout configuration (FIG. 5), while the CPU package side of the connection may use the checkerboard-like pinout configuration from FIG. 4. This maintains a low inductance path on the CPU package side while providing a higher impedance path through to the PCB. Thus, there is a low impedance path from the CPU package to the capacitors to provide the CPU package with increased AC power, while the path from the capacitors to the PCB is high impedance to maintaining acceptable EMI levels.

FIG. 6 illustrates a pass-through capacitor configuration to achieve the combination of the pinout configurations in FIGS. 4 and 5. The pass-through capacitors 620 are positioned between the CPU package 640 and the PCB 610. The bottom of each capacitors 620 and 630 are connected to the top of the PCB 610, and the top of each capacitors 620 and 630 are connected to the bottom of the CPU package 640. As mentioned above, the capacitors 620 and 630 are arranged in such a way as to maintain low impedance on the bottom side of the CPU package 640 and maintain high inductance on the top side of PCB 610 (e.g. the pinout arrangements in FIGS. 4 and 5). More particularly, the checkerboard-like pinout arrangement of FIG. 4 is achieved by connecting both the top side power and ground connections to the CPU package. Also as set out above, the high inductance pinout arrangement is achieved by using capacitors with only bottom side power terminals in the center region and using capacitors with only bottom side ground connections in the peripheral region.

FIGS. 7A and 7B are representative section views of the capacitor 620 used in the FIG. 4-6 implementations. FIG. 7A is a section view illustrating the bottom power terminals 750 interconnected with the top power terminals 730 by way of a metal power plane 710 or other conducting member. FIG. 7A may be a capacitor used to connect power terminals from the CPU package to the PCB. FIG. 7B is a section view illustrating a ground plane 720 or other grounding member disconnected from power terminals 750. FIG. 7B may be a capacitor used to connect ground terminals from the CPU package to the PCB. The power and ground planes 710 and 720 are separated by a dielectric 760. The capacitor 720 only allows power to pass from the top power terminals 730 to the bottom power terminals 750, while the ground plane 720 provides a ground connection for the top ground terminals 740. The ground plane 720, due to its lack of connection to the PCB side of the capacitor, also prohibits direct current (D/C) power from passing straight through the capacitor 620. Furthermore, a large portion of the high frequency power is supplied by the capacitor 620 which is formed from the dielectric 760, the power plate 710, and the ground plate 720, rather than being supplied through the direct connection to the PCB.

Figure 7D:
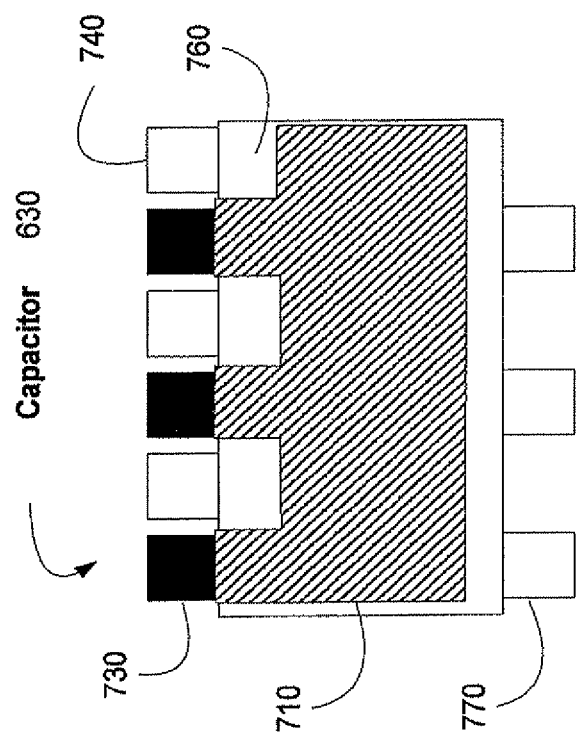
FIG. 7D is a second representative section view of another particular pass-through capacitor conforming to aspects of the present invention.
Figure 7C:
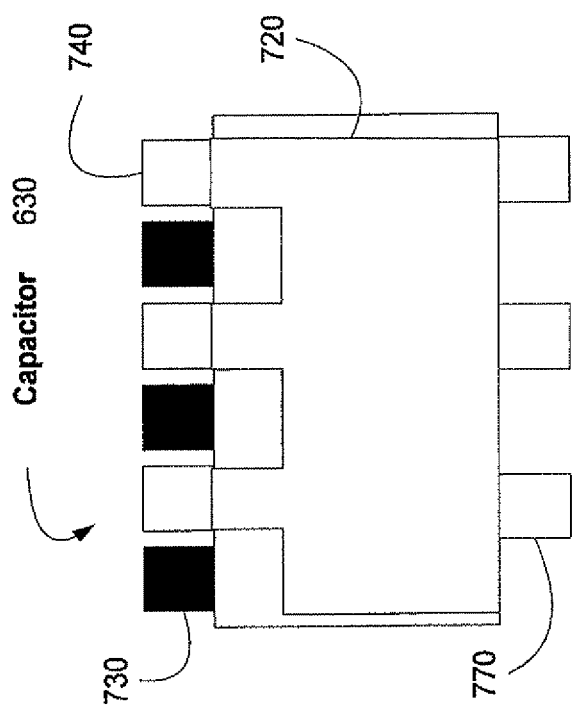
FIG. 7C is a representative section view of another particular pass-through capacitor configuration conforming to aspects of the present invention.

FIGS. 7C and 7D are representative section views of the capacitor 630 used in the FIG. 4-6 implementations. FIG. 7C is a section view illustrating the bottom ground terminals 770 interconnected with the top ground terminals 740 by way of ground plane 720. FIG. 7D is a section view illustrating power plane 710 disconnected from ground terminals 770. Due to this disconnection of the power plane 710, the capacitor 630 does not allow power to pass through to the PCB, and only provides a grounding effect.

The top power terminals 730 and the top ground terminals 740 alternate between power and ground. This alternating configuration allows the bottom side of the CPU package 640 to connect to the capacitors 620 and 630 while maintaining the checkerboard-like pinout configuration of FIG. 4. Accordingly, more connection points are created on the CPU package 640 side to maintain low impedance on the bottom side of the CPU package 640. The bottom power and ground terminals 750 and 770 are grouped together as either all power or all ground (e.g. either the capacitor 620 or the capacitor 630). Thus, the pinout on the top of the PCB 610 is maintained in the high inductance configuration of FIG. 5. This is achieved by placing multiple capacitors 620 with the bottom power terminals 750 in the center region of the pinout, while placing multiple capacitors 630 with the bottom ground terminals 770 in the peripheral region of the pinout. Thus, because grouping of the connection points lower EMI is effectively maintained.

Figure 8:
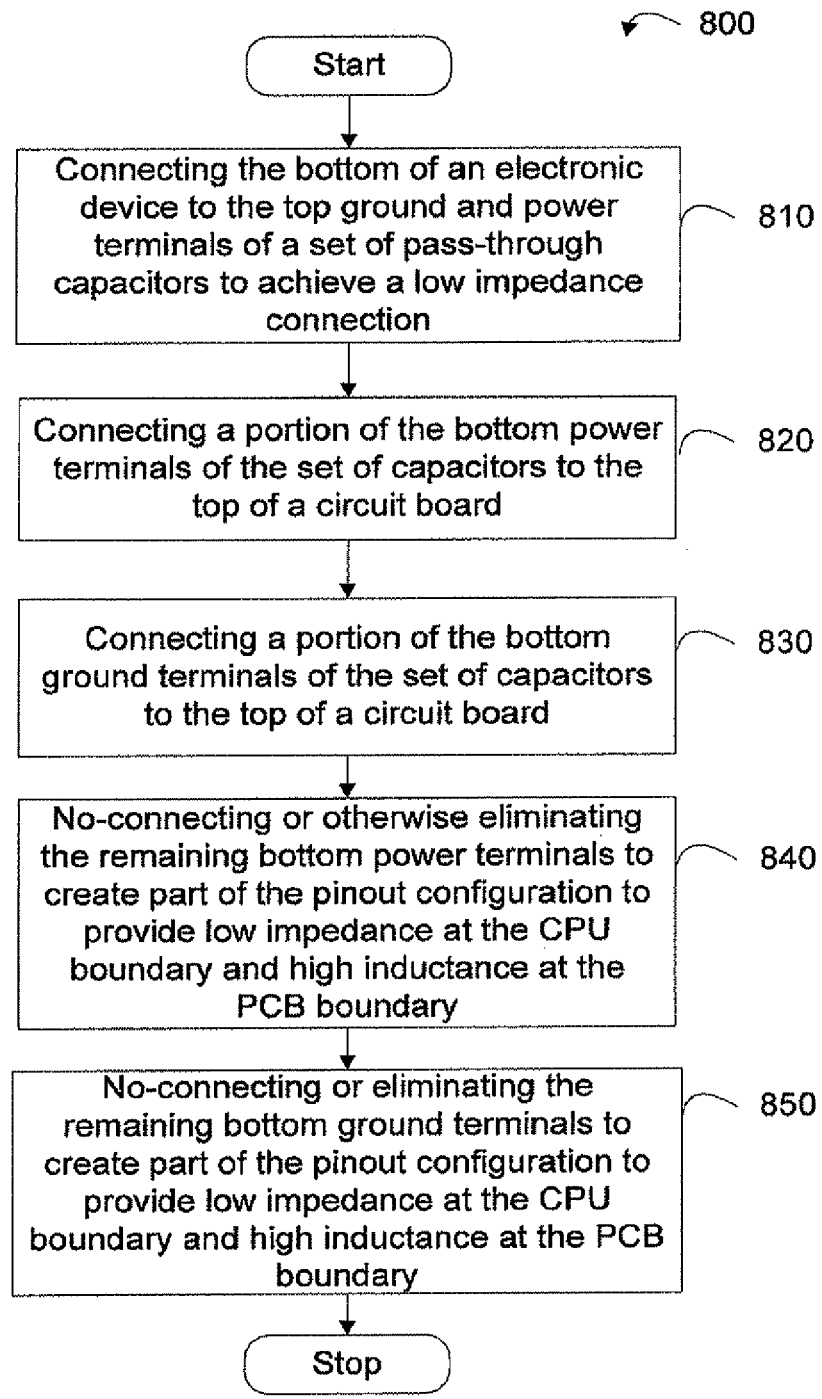
FIG. 8 is a flow diagram illustrating a method according to one embodiment of the present invention.

FIG. 8 is a flow diagram showing a method according to embodiments of the present invention. Method 800 connects the bottom of an electronic device (e.g. CPU package 320) to the tops of multiple capacitors (e.g. capacitor 210) to achieve a low impedance connection. An electronic device is thereby connected using power and ground terminals from the capacitors (operation 810).

A portion of the bottom power terminals of the multiple capacitors is connected to the top of a circuit board (e.g. PCB 310) (operation 820). A portion of the bottom ground terminals of the multiple capacitors is connected to the top of the circuit board (operation 830). Method 800 then no-connects the remaining bottom power terminals to the top of the circuit board to provide low impedance at the CPU boundary and high inductance at the PCB boundary (operation 840). Further, method 800 no-connects the remaining bottom ground terminals to the top of the circuit board to provide low impedance at the CPU boundary and high inductance at the PCB boundary (operation 850).

In one embodiment, method 800 connects the capacitors in such a way to implement a pinout configuration the same as in FIG. 1. However, other configurations may be implemented.

Figure 9:
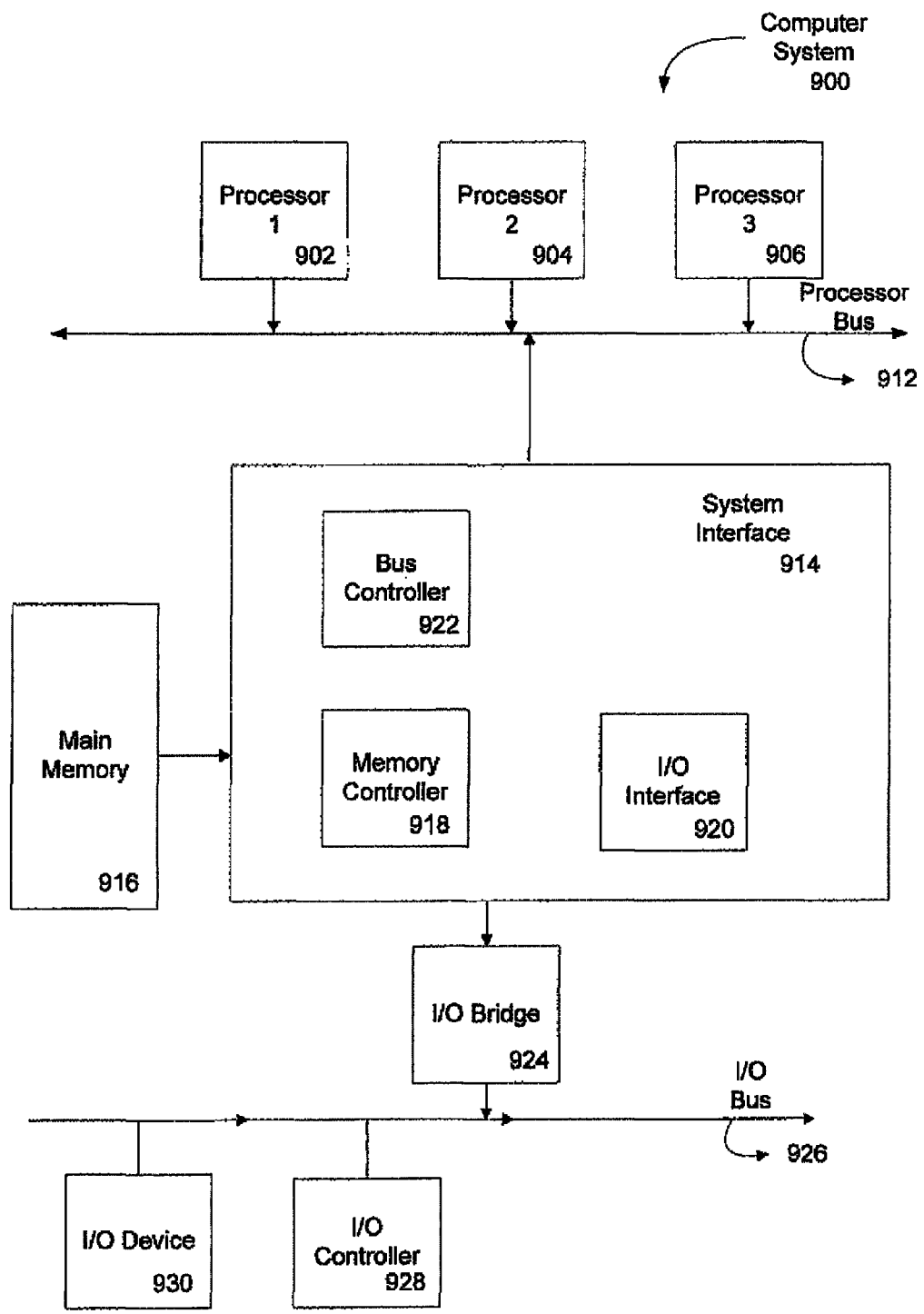
FIG. 9 is a block diagram illustrating a computer system.

Referring now to FIG. 9 which is a block diagram illustrating an exemplary computer system 900 to be used in implementing embodiments of the present invention. Specifically, computer system 900 may be used to control the fabrication process in accordance with aspects of the present invention. Alternatively, portions of computer system 900 may also replaced with aspects of the present invention.

The computer system (system) includes one or more processors 902-906. The processors 902-906 may include one or more single-threaded or multi-threaded processors. A typical multi-threaded processor may include multiple threads or logical processors, and may be capable of processing multiple instruction sequences concurrently using its multiple threads. Processors 902-906 may also include one or more internal levels of cache (not shown) and a bus controller or bus interface unit to direct interaction with the processor bus 912.

Processor bus 912, also known as the host bus or the front side bus, may be used to couple the processors 902-906 (e.g. CPU package 320 or 640) with the system interface 914. System interface 914 (e.g. PCB 310 or 610) may be connected to the processor bus 912 to interface other components of the system 900 with the processor bus 912. For example, system interface 914 may include a memory controller 918 for interfacing a main memory 916 with the processor bus 912. The main memory 916 typically includes one or more memory cards and a control circuit (not shown). System interface 914 may also include an input/output (I/O) interface 920 to interface one or more I/O bridges or I/O devices with the processor bus 912. For example, as illustrated, the I/O interface 920 may interface an I/O bridge 924 with the processor bus 912. I/O bridge 924 may operate as a bus bridge to interface between the system interface 914 and an I/O bus 926. One or more I/O controllers and/or I/O devices may be connected with the I/O bus 926, such as I/O controller 928 and I/O device 930, as illustrated. I/O bus 926 may include a peripheral component interconnect (PCI) bus or other type of I/O bus.

System 900 may include a dynamic storage device, referred to as main memory 916, or a random access memory (RAM) or other devices coupled to the processor bus 912 for storing information and instructions to be executed by the processors 902-906. Main memory 916 also may be used for storing temporary variables or other intermediate information during execution of instructions by the processors 902-906. System 900 may include a read only memory (ROM) and/or other static storage device coupled to the processor bus 912 for storing static information and instructions for the processors 902-906.

Main memory 916 or dynamic storage device may include a magnetic disk or an optical disc for storing information and instructions. I/O device 930 may include a display device (not shown), such as a cathode ray tube (CRT) or liquid crystal display (LCD), for displaying information to an end user. For example, graphical and/or textual indications of installation status, time remaining in the trial period, and other information may be presented to the prospective purchaser on the display device. I/O device 930 may also include an input device (not shown), such as an alphanumeric input device, including alphanumeric and other keys for communicating information and/or command selections to the processors 902-906. Another type of user input device includes cursor control, such as a mouse, a trackball, or cursor direction keys for communicating direction information and command selections to the processors 902-906 and for controlling cursor movement on the display device.

System 900 may also include a communication device (not shown), such as a modem, a network interface card, or other well-known interface devices, such as those used for coupling to Ethernet, token ring, or other types of physical attachment for purposes of providing a communication link to support a local or wide area network, for example. Stated differently, the system 900 may be coupled with a number of clients and/or servers via a conventional network infrastructure, such as a company's Intranet and/or the Internet, for example.

It is appreciated that a lesser or more equipped system than the example described above may be desirable for certain implementations. Therefore, the configuration of system 900 may vary from implementation to implementation depending upon numerous factors, such as price constraints, performance requirements, technological improvements, and/or other circumstances.

It should be noted that, while the embodiments described herein may be performed under the control of a programmed processor, such as processors 902-906, in alternative embodiments, the embodiments may be fully or partially implemented by any programmable or hard coded logic, such as field programmable gate arrays (FPGAs), transistor logic (TTL), or application specific integrated circuits (ASICs). Additionally, the embodiments of the present invention may be performed by any combination of programmed general purpose computer components and/or custom hardware components. Therefore, nothing disclosed herein should be construed as limiting the various embodiments of the present invention to a particular embodiment wherein the recited embodiments may be performed by a specific combination of hardware components.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention. Embodiments within the scope of the present invention also include computer readable media for carrying or having computer executable instructions or data structures stored thereon. Such computer readable media may be any available media that can be accessed by a general purpose or special purpose computer (e.g. computer system 900). By way of example, and not limitation, such computer readable media can comprise RAM, ROM, PROM, EPROM, EEPROM, DVD, CD ROM or other optical disk storage, magnetic disk storage or other magnetic storage devices, or any other medium which can be used to carry or store desired program code means in the form of computer executable instructions or data structures and which can be accessed by a general purpose or special purpose computer. When information is transferred or provided over a network or another communications link or connection (either hardwired, wireless, or a combination of hardwired or wireless) to a computer, the computer properly views the connection as a computer readable medium. Thus, any such a connection is properly termed a computer readable medium. Combinations of the above should also be included within the scope of computer readable media. Computer executable instructions comprise, for example, instructions and data which cause a general purpose computer, special purpose computer, or special purpose processing device to perform a certain function or group of functions.

What is claimed is:

1. A pass through capacitor comprising: a plurality of power terminals disposed along a top surface of the pass through capacitor and in electrical communication with at least one first corresponding conductive member comprising a metal power plane, the metal power plane comprising a generally rectangular shape comprising a first side with a first length and a second side with a second length, the first length longer than the second length; a plurality of ground terminals disposed along the top surface of the pass through capacitor and in electrical communication with at least one corresponding second conductive member comprising a metal ground plane, the metal ground plane comprising a generally rectangular shape comprising a third side with a third length and a fourth side with a fourth length, the third length longer than the fourth length; the at least one first conductive member comprising the metal power plane and the at least one second conductive member comprising the metal ground plane physically separated with a dielectric material; at least one third terminal disposed along a bottom surface of the pass through capacitor, the bottom surface opposite the top surface, the at least third terminal in electrical communication with the at least one first conductive member comprising the metal power plane, the metal power plane configured such that the plurality of power terminals and the at least one third terminal are not vertically aligned through the pass through capacitor; and the at least one second conductive member comprising the metal ground plane being electrically connectable by way of the plurality of ground terminals, the at least one second conductive member comprising the metal ground plane being otherwise electrically isolated by the dielectric material; wherein, the first length of the metal power plane and the third length of the metal ground plane are parallel to the top surface of the pass through capacitor and the bottom surface of the pass through capacitor and the second length of the metal power plane and the fourth length of the metal ground plane are substantially the same length as a distance between the top surface and the bottom surface of the pass through capacitor; wherein the plurality of power and ground terminals are in an alternating configuration.

2. The capacitor of claim 1, wherein the at least one third terminal is a power terminal or a ground terminal.

3. The capacitor of claim 1, wherein the at least one third terminal is a plurality of terminals.

4. An apparatus comprising: an electronic device; a printed circuit board (PCB); a plurality of pass-through capacitors electrically and directly connected between the electronic device and the PCB, each pass-through capacitor having power and ground terminals, the power terminals being electrically connected with at least a first metal plane and the ground terminals being connected with at least a second metal plane, the first and second metal planes being separated by a dielectric, wherein a portion of the power terminals and a portion of the ground terminals are electrically isolated from the PCB; the plurality of pass through capacitors providing alternating power and ground connections to the electronic device, the alternating power and ground connections defining a checker board pattern; and the plurality of pass through capacitors providing a first portion arranged to connect to the PCB around a peripheral region of the electronic device and a second portion arranged to connect to the PCB around a center region of the electronic device, wherein the peripheral region surrounds the center region; and wherein about one-half of the power terminals and about one-half of the ground terminals are no-connected to the PCB.

5. The apparatus of claim 4, wherein the power terminals of the first portion of pass-through capacitors are no-connected to the PCB.

6. The apparatus of claim 4, wherein the ground terminals of the second portion of pass-through capacitors are no-connected to the PCB.

7. The apparatus of claim 4, wherein the electronic device is a central processing unit (CPU) package.

8. The apparatus of claim 4, wherein the plurality of pass-through capacitors are electrically connected to the PCB using one or more of the following:

a socket, a soldered ball grid array (BGA), and pin contacts.

* * * * *